(12) United States Patent
Liu (10) Patent No.: US 11,769,859 B2
(45) Date of Patent: Sep. 26, 2023

(54) MID-INFRARED LIGHT EMITTING DIODE WITH GRAPHENE AND BLACK PHOSPHOROUS LAYERS AND MANUFACTURING METHOD THEREOF, SILICON PHOTONIC CIRCUIT INCLUDING THE MID-INFRARED LIGHT EMITTING DIODE AND MANUFACTURING METHOD THEREOF

(71) Applicant: National Tsing Hua University, Hsinchu (TW)

(72) Inventor: Chang-Hua Liu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 302 days.

(21) Appl. No.: 17/129,932

(22) Filed: Dec. 22, 2020

(65) Prior Publication Data
US 2022/0140187 A1 May 5, 2022

(30) Foreign Application Priority Data

Nov. 2, 2020 (TW) .................................. 109138125

(51) Int. Cl.
*H01L 33/26* (2010.01)
*H01L 33/00* (2010.01)
(Continued)

(52) U.S. Cl.
CPC ............ *H01L 33/26* (2013.01); *G02B 6/4287* (2013.01); *H01L 33/005* (2013.01); *H01L 33/40* (2013.01);
(Continued)

(58) Field of Classification Search
CPC .. G02B 6/102; H01L 33/26; H01L 2933/0016
See application file for complete search history.

(56) References Cited

U.S. PATENT DOCUMENTS

| 2011/0163298 A1 | 7/2011 | Sung |
| 2014/0087501 A1 | 3/2014 | Chen et al. |

(Continued)

FOREIGN PATENT DOCUMENTS

| CN | 108695414 | 10/2018 |
| TW | 201919109 | 5/2019 |

OTHER PUBLICATIONS

Xinrong Zong et al., "Black phosphorus-based van der Waals heterostructures for mid-infrared light-emission applications," Light: Science & Applications, vol. 9, No. 114, Jul. 2, 2020, pp. 1-8.

(Continued)

*Primary Examiner* — Jay C Chang
*Assistant Examiner* — Mikka Liu
(74) *Attorney, Agent, or Firm* — JCIPRNET (57) ABSTRACT

A mid-infrared light emitting diode is provided, including a graphene lower electrode layer, a black phosphorous layer, and a graphene upper electrode layer sequentially arranged along a thickness direction of the mid-infrared light emitting diode, in which the black phosphorous layer contacts the graphene lower electrode layer and the graphene upper electrode layer. A manufacturing method of the mid-infrared light emitting diode, a silicon photonic circuit and a manufacturing method thereof are also provided.

10 Claims, 6 Drawing Sheets

(51) Int. Cl.
H01L 33/40 (2010.01)
H01L 33/58 (2010.01)
G02B 6/42 (2006.01)

(52) U.S. Cl.
CPC ...... H01L 33/58 (2013.01); *H01L 2933/0016* (2013.01); *H01L 2933/0058* (2013.01)

(56) References Cited

U.S. PATENT DOCUMENTS

| | | | |
|---|---|---|---|
| 2016/0155971 A1* | 6/2016 | Strachan | H01L 29/0673 257/29 |
| 2017/0243998 A1 | 8/2017 | Park et al. | |
| 2018/0267246 A1* | 9/2018 | Zhang | G02B 6/29338 |
| 2019/0055668 A1 | 2/2019 | Zhang et al. | |

OTHER PUBLICATIONS

Tian-Yun Chang et al., "Black Phosphorus Mid-Infrared Light-Emitting Diodes Integrated with Silicon Photonic Waveguides," Nano Lett., vol. 20, No. 9, Aug. 20, 2020, pp. 6824-6830.

"Office Action of Taiwan Counterpart Application", dated Jun. 17, 2021, p. 1-p. 7.

* cited by examiner

MID-INFRARED LIGHT EMITTING DIODE WITH GRAPHENE AND BLACK PHOSPHOROUS LAYERS AND MANUFACTURING METHOD THEREOF, SILICON PHOTONIC CIRCUIT INCLUDING THE MID-INFRARED LIGHT EMITTING DIODE AND MANUFACTURING METHOD THEREOF

CROSS-REFERENCE TO RELATED APPLICATION

This application claims the priority benefit of Taiwanese application serial no. 109138125, filed on Nov. 2, 2020. The entirety of the above-mentioned patent application is hereby incorporated by reference herein and made a part of this specification.

BACKGROUND

Technical Field

The disclosure relates to a semiconductor device and a manufacturing method thereof, and particularly to a mid-infrared light emitting diode and a manufacturing method thereof, as well as a silicon photonic circuit and a manufacturing method thereof.

Description of Related Art

At present, most mid-infrared light emitting devices are realized by molecular beam epitaxy. However, how to control parameters (such as thicknesses and materials of different epitaxial layers or buffer layers) in a molecular beam epitaxy process becomes a technical problem. In addition, there are many limitations on a growth substrate for molecular beam epitaxy, thereby increasing the production cost of a mid-infrared light emitting device and making it difficult to integrate the mid-infrared light emitting device with a silicon substrate. Further, the application scope of mid-infrared light emitting diodes is limited and manufacturing cost thereof is increased.

SUMMARY

The disclosure provides a mid-infrared light emitting diode and a manufacturing method thereof, as well as a silicon photonic circuit and a manufacturing method thereof, in which the mid-infrared light emitting diode may be integrated on various substrates to serve as a light source.

According to an embodiment of the disclosure, a mid-infrared light emitting diode includes a graphene lower electrode layer, a black phosphorous layer, and a graphene upper electrode layer sequentially arranged along a thickness direction of the mid-infrared light emitting diode, in which the black phosphorous layer contacts the graphene lower electrode layer and the graphene upper electrode layer.

According to an embodiment of the disclosure, a manufacturing method of a mid-infrared light emitting diode includes the following. A graphene lower electrode layer, a black phosphorous layer, and a graphene upper electrode layer are formed by mechanical exfoliation. The graphene lower electrode layer, the black phosphorous layer, and the graphene upper electrode layer are vertically stacked in sequence by dry transfer, in which the black phosphorous layer contacts the graphene lower electrode layer and the graphene upper electrode layer.

According to an embodiment of the disclosure, a silicon photonic circuit includes a silicon waveguide device and a mid-infrared light emitting diode. The silicon waveguide device includes a substrate, a silicon waveguide, and multiple electrodes. The silicon waveguide is arranged on the substrate. The multiple electrodes are arranged on the substrate and separated from the silicon waveguide. The mid-infrared light emitting diode is arranged on the silicon waveguide device and includes a graphene lower electrode layer, a black phosphorous layer, and a graphene upper electrode layer sequentially arranged along a thickness direction of the mid-infrared light emitting diode, in which the black phosphorous layer contacts the graphene lower electrode layer and the graphene upper electrode layer, and the graphene lower electrode layer and the graphene upper electrode layer are respectively electrically connected to the multiple electrodes.

According to an embodiment of the disclosure, a manufacturing method of a silicon photonic circuit includes the following. A silicon waveguide and multiple electrodes are formed on a substrate, so as to form a silicon waveguide device. A graphene lower electrode layer, a black phosphorous layer, and a graphene upper electrode layer are formed by mechanical exfoliation. The graphene lower electrode layer, the black phosphorous layer, and the graphene upper electrode layer are vertically stacked in sequence by dry transfer, so as to form a mid-infrared light emitting diode, in which the black phosphorous layer contacts the graphene lower electrode layer and the graphene upper electrode layer. The mid-infrared light emitting diode is formed on the silicon waveguide device by dry transfer, in which the graphene lower electrode layer and the graphene upper electrode layer are respectively electrically connected to the multiple electrodes.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Directional terms used herein, such as "upper," "lower," "front," "rear," "left" and "right," merely refer to directions in the accompanying drawings. Therefore, the directional terms are used to illustrate rather than limit the disclosure.

In the accompanying drawings, each drawing depicts general features of methods, structures, or materials used in specific embodiments. However, these drawings should not be construed as defining or limiting the scope or nature covered by these embodiments. For example, for clarity, the relative size, thickness and position of each layer, region or structure may be reduced or enlarged.

In the present specification or claims, a description that one element/layer is arranged on (or above) another element/layer covers both the case where these two elements/layers directly contact each other and the case where other element/layer is present between these two elements/layers.

In the following embodiments, the same or similar elements will be denoted by the same or similar reference numerals, and repeated description thereof will be omitted. In addition, the features in different embodiments can be combined without conflict, and all simple equivalent changes and modifications made in accordance with the present specification or claims still fall within the scope of the disclosure.

Figure 1:
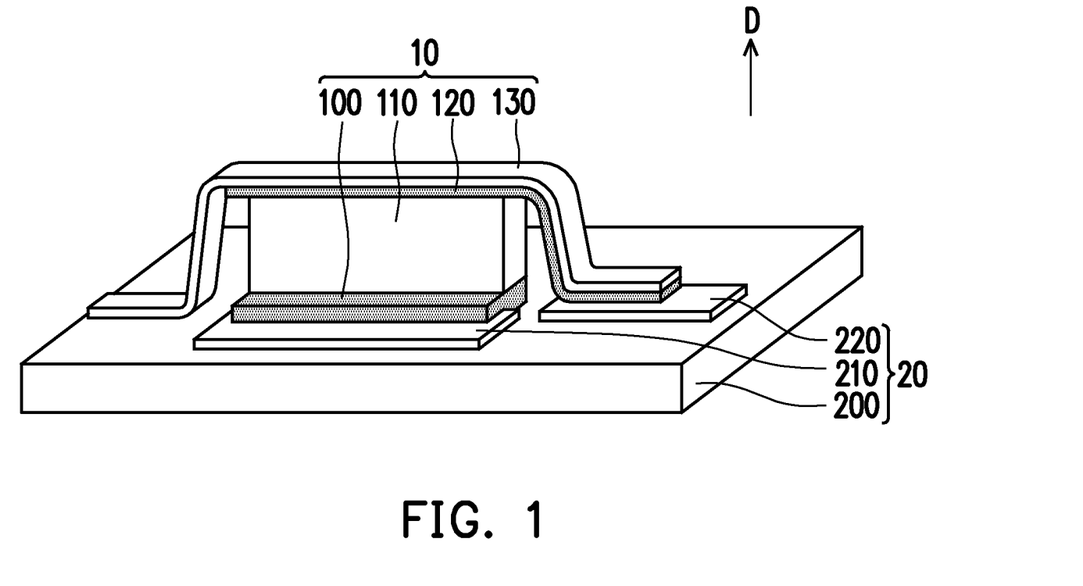
FIG. 1 is a schematic view of a mid-infrared light emitting diode according to an embodiment of the disclosure.
Figure 2:
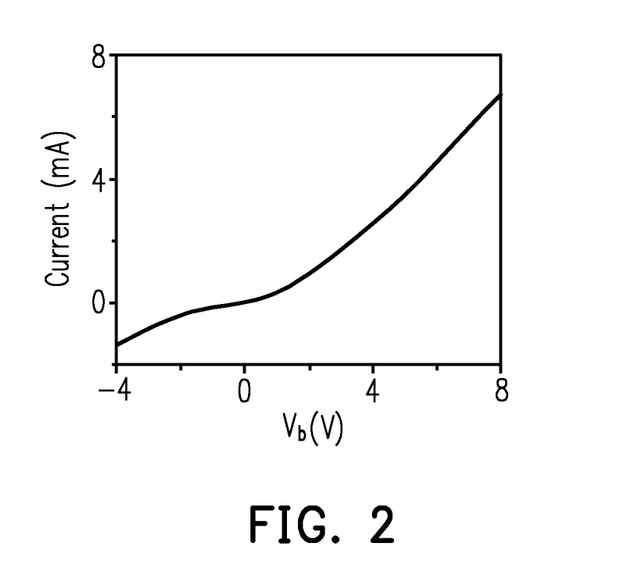
FIG. 2 to FIG. 7 illustrate photoelectric performance of a mid-infrared light emitting diode according to an embodiment of the disclosure.

FIG. 1 is a schematic view of a mid-infrared light emitting diode according to an embodiment of the disclosure. FIG. 2 to FIG. 7 illustrate photoelectric performance of a mid-infrared light emitting diode according to an embodiment of the disclosure.

Referring first to FIG. 1, a mid-infrared light emitting diode 10 may include a graphene lower electrode layer 100, a black phosphorous layer 110, and a graphene upper electrode layer 120. Since graphene and black phosphorous are van der Waals materials, they can be held together by the van der Waals force. In detail, in the mid-infrared light emitting diode 10, the graphene lower electrode layer 100, the black phosphorous layer 110 and the graphene upper electrode layer 120 may be sequentially arranged or stacked along a thickness direction D of the mid-infrared light emitting diode 10, thereby forming a heterostructure. The black phosphorous layer 110 contacts the graphene lower electrode layer 100 and the graphene upper electrode layer 120. In other words, there are no other elements or layers between the black phosphorous layer 110 and the graphene lower electrode layer 100, and there are no other elements or layers between the black phosphorous layer 110 and the graphene upper electrode layer 120.

In the mid-infrared light emitting diode 10, the graphene lower electrode layer 100 and the graphene upper electrode layer 120 are translucent in a mid-infrared band. The term "translucent" does not necessarily mean having a transmittance of half of 100%. In other words, the graphene lower electrode layer 100 and the graphene upper electrode layer 120 allow passage of light in the mid-infrared band.

In the mid-infrared light emitting diode 10, the graphene lower electrode layer 100 and the graphene upper electrode layer 120 are able to provide high current density to the black phosphorous layer 110. According to FIG. 2, as a bias voltage $V_b$ between the graphene lower electrode layer 100 and the graphene upper electrode layer 120 increases, a current as high as 6.7 mA may be injected into the black phosphorous layer 110 of about 1200 $\mu m^2$; that is, the current density may become as high as $5.58 \times 10^5$ mA/$cm^2$.

In the mid-infrared light emitting diode 10, the black phosphorous layer 110 serves as a light emitting layer. According to FIG. 3, when the bias voltage $V_b$ between the graphene lower electrode layer 100 and the graphene upper electrode layer 120 falls within a range of 1 volt (V) to 8 V, a spectrum of the black phosphorous layer 110 covers a technically important mid-infrared atmosphere window, and a peak wavelength of the black phosphorous layer 110 is, for example but not limited to, 3.64 $\mu m$. In other embodiments, the peak wavelength of the black phosphorous layer 110 can be changed by adjusting the number or thickness of the black phosphorous layer 110.

Figure 3:
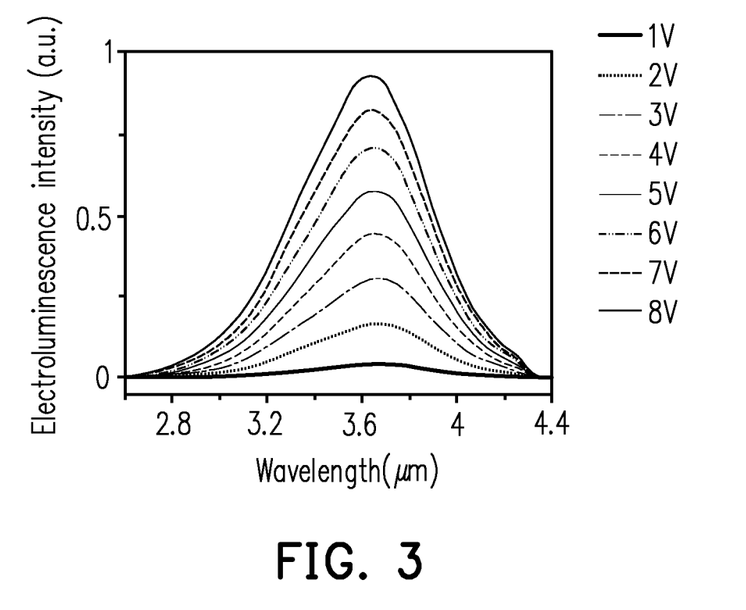
Figure 4:
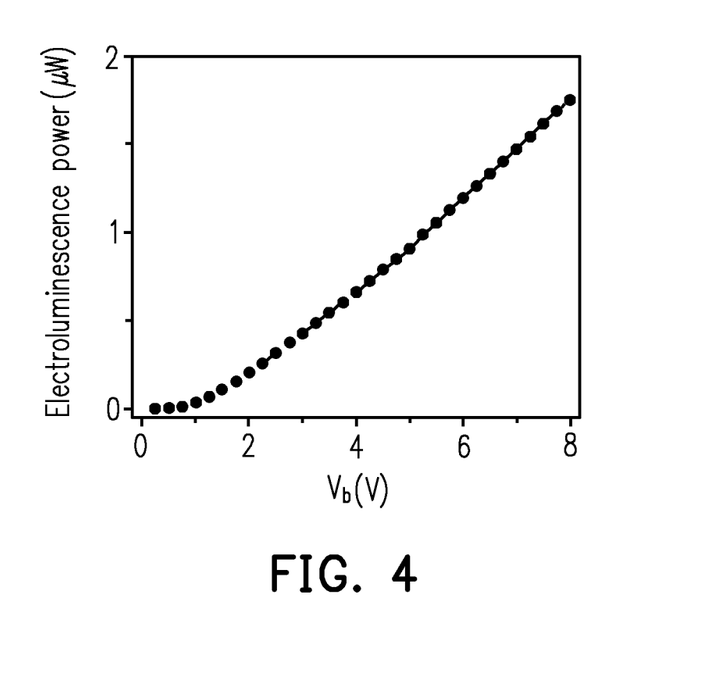
Figure 5:
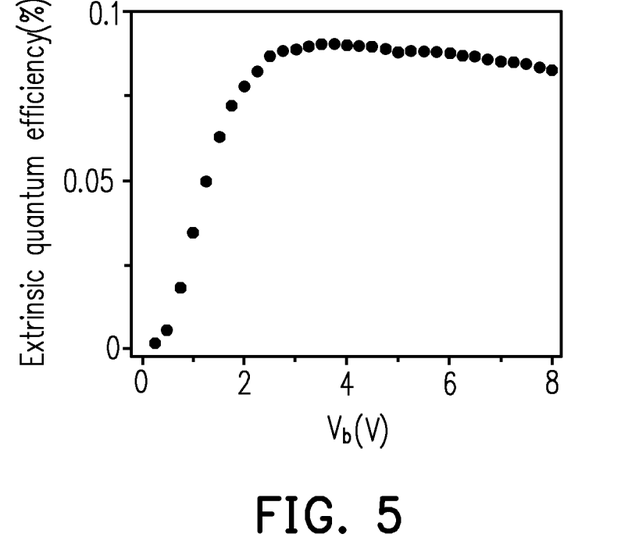

According to FIG. 3, full width at half maximum (FWHM) of electroluminescence increases as the bias voltage $V_b$ increases. This means that a large vertical electric field and high current injection density may enable carriers to be redistributed into a relatively high energy state in momentum space of the black phosphorous layer, and may increase luminous intensity or electroluminescence power. FIG. 4 shows the electroluminescence power of the mid-infrared light emitting diode 10 under various bias voltages $V_b$. According to FIG. 4, a bipolar charge is injected into the black phosphorous layer 110 at a very low bias voltage (when $V_b$ is equal to about 0.45 V). According to some experimental examples, the black phosphorous layer 110 of about 1200 $\mu m^2$ may have an output power of nearly 1.8 $\mu W$, and may exhibit good stability within an operating time of at least 100 hours.

The mid-infrared light emitting diode 10 has an extrinsic quantum efficiency ($\eta$) of (qN)/I, in which q denotes electron charge, N denotes the number of photons emitted into free space per second, and I denotes the current injected into the mid-infrared light emitting diode 10. According to FIG. 5, when the bias voltage $V_b$ is 3.5 V, the extrinsic quantum efficiency of the mid-infrared light emitting diode 10 may be close to 0.09%, which is comparable to the performance of other group III-V mid-infrared light emitting diodes. In addition, the extrinsic quantum efficiency of the mid-infrared light emitting diode 10 may have a small degree of reduction under a high bias voltage $V_b$.

Figure 6:
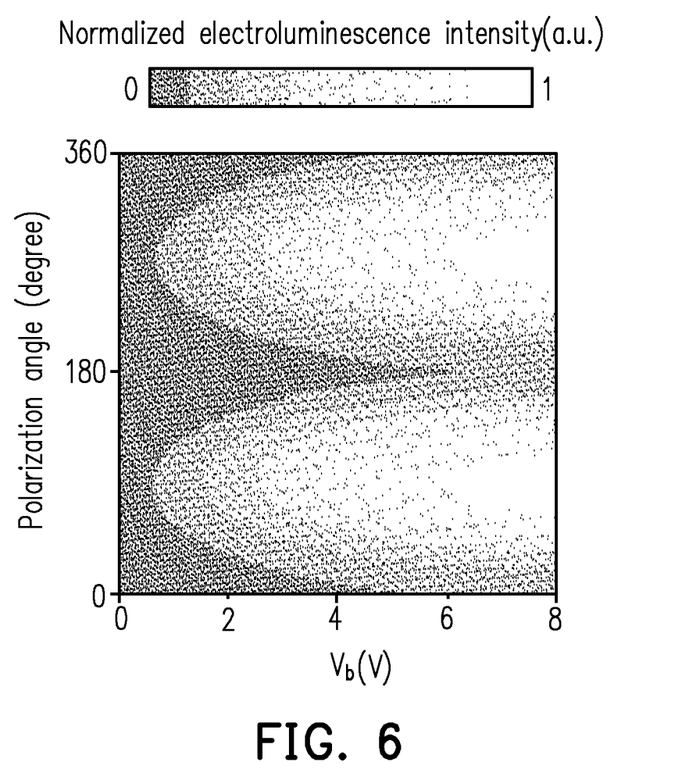

According to FIG. 6, light emitted by the mid-infrared light emitting diode 10 is linearly polarized. According to some experimental examples, this linear polarization is consistent under different bias voltages. In addition, a polarization factor (p) of the mid-infrared light emitting diode 10 is calculated to be about 80%, and this means that the mid-infrared light emitting diode 10 may be used as a highly polarized mid-infrared light source.

Figure 7:
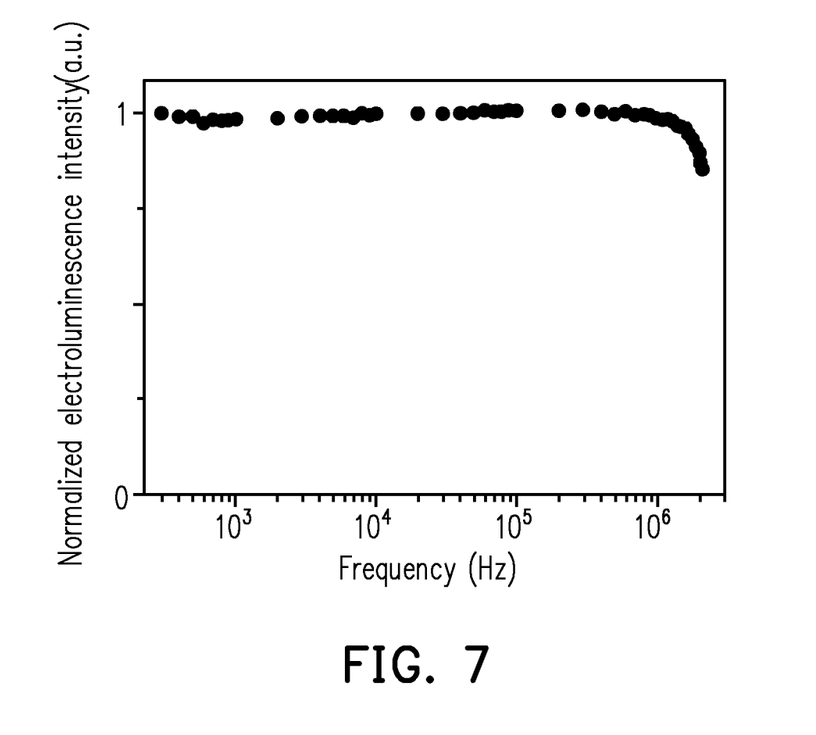

According to FIG. 7, the mid-infrared light emitting diode 10 may be modulated at MHz speed, and this means that the mid-infrared light emitting diode 10 can be applied in free space sensing or spectrum sensing without the need for an external modulator.

Referring again to FIG. 1, according to different needs, the mid-infrared light emitting diode 10 may further include other elements or layers. For example, the mid-infrared light emitting diode 10 may further include a hexagonal boron nitride (hBN) covering layer 130. The hexagonal boron nitride covering layer 130 is arranged on the graphene upper electrode layer 120 to protect the elements located therebelow. Since hexagonal boron nitride is also a van der Waals material, the hexagonal boron nitride covering layer 130 and the graphene upper electrode layer 120 can also be held together by the van der Waals force.

In some embodiments, the mid-infrared light emitting diode 10 may be integrated on a silicon chip 20. The silicon chip 20 may include a substrate 200, an electrode 210, and an electrode 220. The electrode 210 and the electrode 220 are arranged on the substrate 200, and the graphene lower electrode layer 100 and the graphene upper electrode layer 120 are respectively electrically connected to the electrode 210 and the electrode 220. In some embodiments, the substrate 200 may include a silicon dioxide substrate, and the electrode 210 and the electrode 220 may include a metal electrode (such as a stacked layer of chromium and gold). However, the disclosure is not limited thereto.

Figure 8:
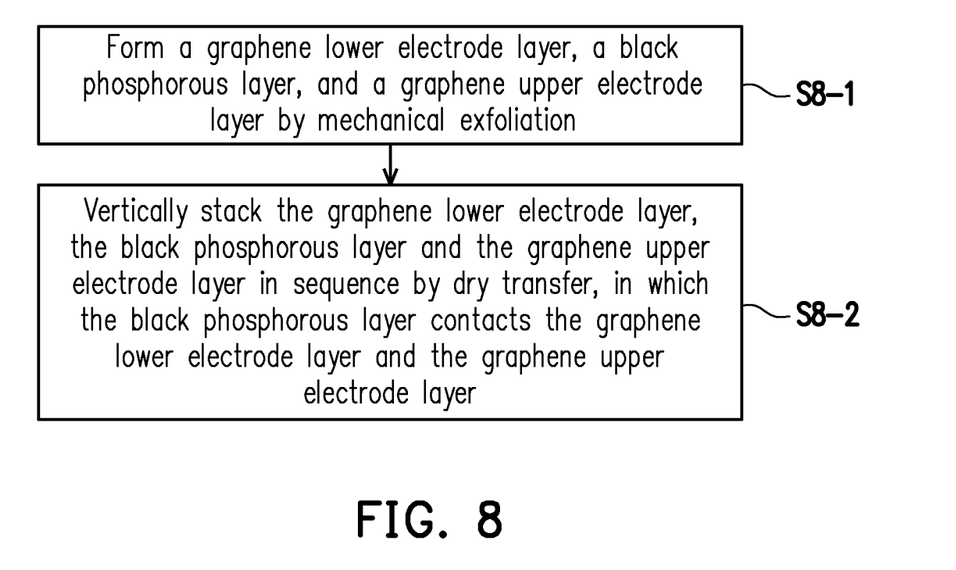
FIG. 8 is a flowchart of a manufacturing method of a mid-infrared light emitting diode according to an embodiment of the disclosure.

FIG. 8 is a flowchart of a manufacturing method of a mid-infrared light emitting diode according to an embodiment of the disclosure. Referring to FIG. 1 and FIG. 8, a manufacturing method of the mid-infrared light emitting diode 10 may include the following steps. Firstly, the graphene lower electrode layer 100, the black phosphorous layer 110 and the graphene upper electrode layer 120 are formed by mechanical exfoliation (step S8-1). Next, the graphene lower electrode layer 100, the black phosphorous layer 110 and the graphene upper electrode layer 120 are vertically stacked in sequence by dry transfer, in which the black phosphorous layer 110 contacts the graphene lower electrode layer 100 and the graphene upper electrode layer 120 (step S8-2).

Under the architecture of FIG. 1, the manufacturing method of the mid-infrared light emitting diode 10 may further include the following steps. The hexagonal boron nitride covering layer 130 is formed by mechanical exfoliation. Next, the hexagonal boron nitride covering layer 130 is arranged on the graphene upper electrode layer 120 by dry transfer. Then, a heterostructure including the graphene lower electrode layer 100, the black phosphorous layer 110, the graphene upper electrode layer 120 and the hexagonal boron nitride covering layer 130 is transferred onto the substrate 200 on which the electrode 210 and the electrode 220 are formed. During the transfer, the graphene lower electrode layer 100 and the graphene upper electrode layer 120 are respectively aligned with the electrode 210 and the electrode 220, so as to be connected to the electrode 210 and the electrode 220, respectively.

Figure 9:
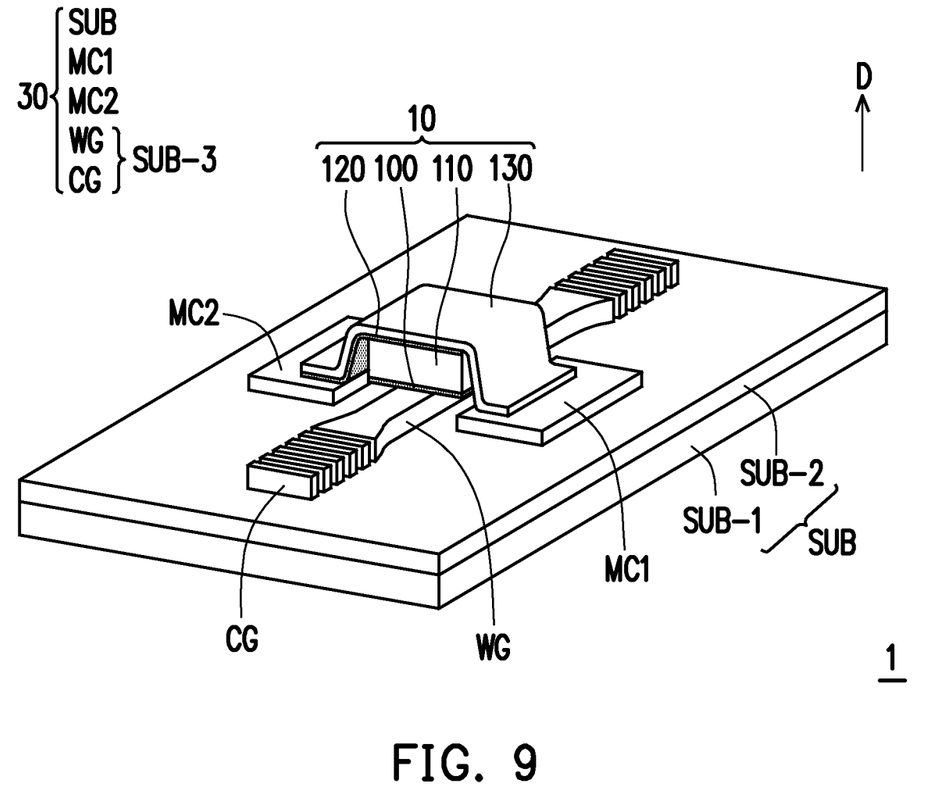
FIG. 9 is a schematic view of a silicon photonic circuit according to an embodiment of the disclosure.

FIG. 9 is a schematic view of a silicon photonic circuit according to an embodiment of the disclosure. Referring to FIG. 9, a silicon photonic circuit 1 includes a silicon waveguide device 30 and the mid-infrared light emitting diode 10. The silicon waveguide device 30 includes a substrate SUB, a silicon waveguide WG, and multiple electrodes (such as an electrode MC1 and an electrode MC2).

The substrate SUB is configured to carry a device or a layer, and may include any kind of semiconductor substrate. For example, the substrate SUB may include a silicon layer, a silicon dioxide layer, or a combination thereof. In this embodiment, the substrate SUB is a stacked layer of a silicon layer SUB-1 and a silicon dioxide layer SUB-2. However, the disclosure is not limited thereto.

The silicon waveguide WG is arranged on the substrate SUB. The silicon waveguide WG is formed, for example, by patterning a silicon layer (not shown) arranged on the substrate SUB. In some embodiments, the silicon waveguide device 30 may further include a coupling grating CG coupled with the silicon waveguide WG. The coupling grating CG is coupled with the silicon waveguide WG. In some embodiments, the coupling grating CG may include the same material as the silicon waveguide WG, and may be formed by the same patterning process as the silicon waveguide WG. However, the disclosure is not limited thereto.

The electrode MC1 and the electrode MC2 are arranged on the substrate SUB and separated from the silicon waveguide WG. Although FIG. 9 schematically shows that the electrode MC1 and the electrode MC2 are respectively located on opposite sides of the silicon waveguide WG, a relative arrangement relationship between the electrode MC1, the electrode MC2 and the silicon waveguide WG may vary according to needs and is not limited to that shown in FIG. 9.

The mid-infrared light emitting diode 10 is arranged on the silicon waveguide device 30 and includes the graphene lower electrode layer 100, the black phosphorous layer 110 and the graphene upper electrode layer 120 that are sequentially arranged along the thickness direction D of the mid-infrared light emitting diode 10. The black phosphorous layer 110 contacts the graphene lower electrode layer 100 and the graphene upper electrode layer 120, and the graphene lower electrode layer 100 and the graphene upper electrode layer 120 are respectively electrically connected to the electrode MC1 and the electrode MC2. In some embodiments, the mid-infrared light emitting diode 10 may further include the hexagonal boron nitride covering layer 130. The hexagonal boron nitride covering layer 130 may be arranged on the graphene upper electrode layer 120. In some embodiments, the hexagonal boron nitride covering layer 130 may further be arranged on the graphene lower electrode layer 100 that is not covered by the black phosphorous layer 110.

Figure 10:
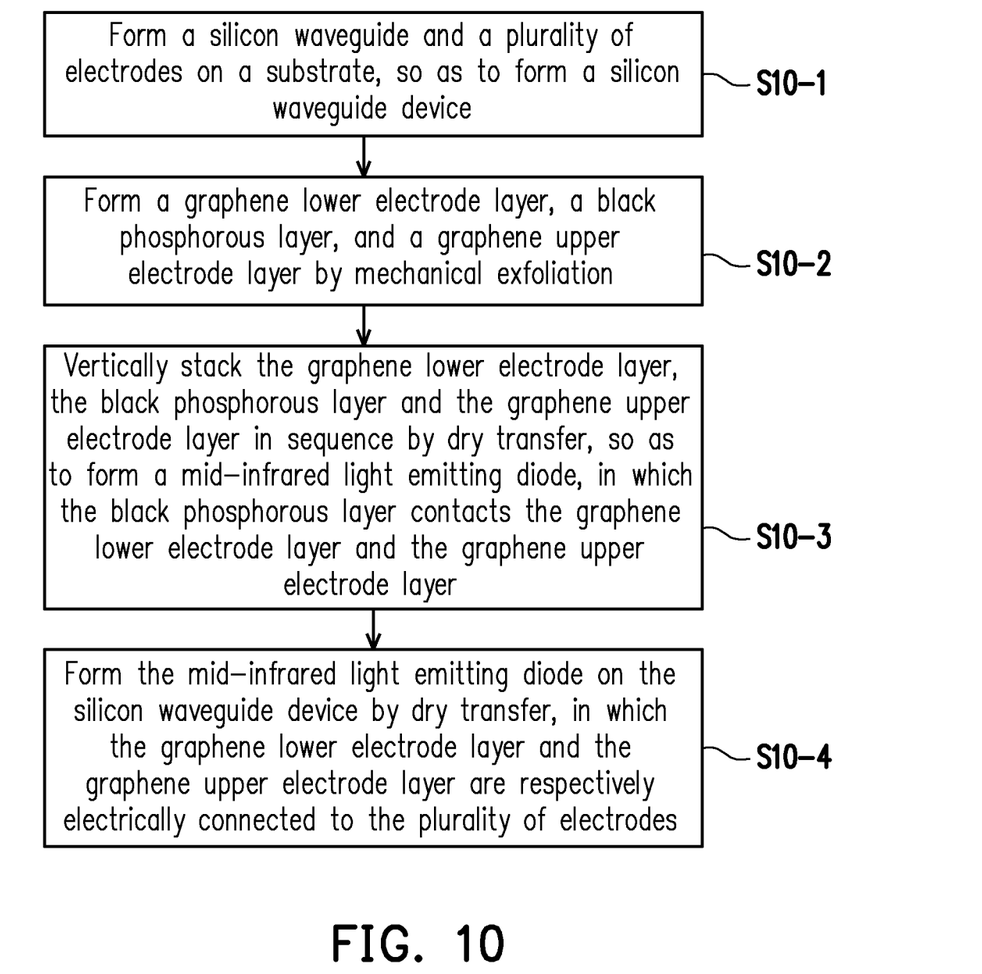
FIG. 10 is a flowchart of a manufacturing method of a silicon photonic circuit according to an embodiment of the disclosure.

FIG. 10 is a flowchart of a manufacturing method of a silicon photonic circuit according to an embodiment of the disclosure. Referring to FIG. 9 and FIG. 10, a manufacturing method of the silicon photonic circuit 1 may include the following steps. Firstly, the silicon waveguide WG and multiple electrodes (such as the electrode MC1 and the electrode MC2) are formed on the substrate SUB, so as to form the silicon waveguide device 30 (step S10-1). In this step, the coupling grating CG may be formed as well.

In detail, a patterning process may be performed on a silicon-on-insulator (SOI) substrate (not shown) to form the silicon waveguide WG and the coupling grating CG. Then, the electrode MC1 and the electrode MC2 are formed. The SOI substrate may include the silicon layer SUB-1, the silicon dioxide layer SUB-2 and a silicon layer SUB-3 sequentially arranged along the thickness direction D. In some embodiments, the thicknesses of the silicon layer SUB-1, the silicon dioxide layer SUB-2 and the silicon layer SUB-3 are respectively 500 μm, 2 μm and 600 nm. However, the disclosure is not limited thereto. The patterning process includes, for example, removing a part of the silicon layer SUB-3 by photolithography to form the silicon waveguide WG and the coupling grating CG. The electrode MC1 and the electrode MC2 are formed on the silicon dioxide layer SUB-2 by, for example, atomic layer deposition and electron beam (e-beam) evaporation. In some embodiments, the electrode MC1 and the electrode MC2 are each a stacked layer of a 10 nm aluminum layer, a 5 nm chromium layer, and a 50 nm gold layer. However, the disclosure is not limited thereto.

Next, the graphene lower electrode layer 100, the black phosphorous layer 110 and the graphene upper electrode layer 120 are formed by mechanical exfoliation (step S10-2). Next, the graphene lower electrode layer 100, the black phosphorous layer 110 and the graphene upper electrode layer 120 are vertically stacked in sequence by dry transfer, so as to form the mid-infrared light emitting diode 10, in which the black phosphorous layer 110 contacts the graphene lower electrode layer 100 and the graphene upper electrode layer 120 (step S10-3). Then, the mid-infrared light emitting diode 10 is formed on the silicon waveguide device 30 by dry transfer, in which the graphene lower electrode layer 100 and the graphene upper electrode layer 120 are respectively electrically connected to the electrode MC1 and the electrode MC2 (step S10-4).

Under the architecture of FIG. 9, the mid-infrared light emitting diode 10 further includes the hexagonal boron nitride covering layer 130. Thus, the manufacturing method of the silicon photonic circuit 1 may further include the following steps. The hexagonal boron nitride covering layer 130 is formed by mechanical exfoliation. Next, the hexagonal boron nitride covering layer 130 is arranged on the graphene upper electrode layer 120 by dry transfer.

In summary, in the embodiments of the disclosure, by applying a heterostructure including graphene and black phosphorus in a mid-infrared light emitting diode, the mid-infrared light emitting diode achieves at least one of the following: emitting linearly polarized light, having high quantum efficiency, having luminous intensity that can be modulated at high speed, and being capable of being integrated on a silicon chip. In addition, compared to a mid-infrared light emitting device manufactured by molecular beam epitaxy, the mid-infrared light emitting diode according to the disclosure may be reduced in production cost and may be integrated with a silicon substrate. In addition, in the silicon photonic circuit and a manufacturing method thereof according to the disclosure, the mid-infrared light emitting diode may be integrated on various substrates to serve as a light source.

Although the disclosure has been described with reference to embodiments thereof, it will be apparent to one of ordinary skill in the art that modifications and variations may be made without departing from the spirit of the disclosure. Accordingly, the scope of the disclosure will be defined by the attached claims.

What is claimed is:

1. A mid-infrared light emitting diode, comprising a graphene lower electrode layer, a black phosphorous layer, and a graphene upper electrode layer sequentially arranged along a thickness direction of the mid-infrared light emitting diode, wherein the black phosphorous layer contacts the graphene lower electrode layer and the graphene upper electrode layer.

2. The mid-infrared light emitting diode according to claim 1, further comprising:
    a hexagonal boron nitride covering layer, arranged on the graphene upper electrode layer.

3. A manufacturing method of a mid-infrared light emitting diode, comprising:
    forming a graphene lower electrode layer, a black phosphorous layer, and a graphene upper electrode layer by mechanical exfoliation; and
    vertically stacking the graphene lower electrode layer, the black phosphorous layer, and the graphene upper electrode layer in sequence by dry transfer, so as to form the mid-infrared light emitting diode, comprising the graphene lower electrode layer, the black phosphorous layer, and the graphene upper electrode layer sequentially arranged along a thickness direction of the mid-infrared light emitting diode, wherein the black phosphorous layer contacts the graphene lower electrode layer and the graphene upper electrode layer.

4. The manufacturing method of a mid-infrared light emitting diode according to claim 3, further comprising:
    forming a hexagonal boron nitride covering layer by mechanical exfoliation; and
    arranging the hexagonal boron nitride covering layer on the graphene upper electrode layer by dry transfer.

5. A silicon photonic circuit, comprising:
    a silicon waveguide device, comprising:
        a substrate;
        a silicon waveguide, arranged on the substrate; and
        a plurality of electrodes, arranged on the substrate and separated from the silicon waveguide; and
    a mid-infrared light emitting diode, arranged on the silicon waveguide device and comprising a graphene lower electrode layer, a black phosphorous layer, and a graphene upper electrode layer sequentially arranged along a thickness direction of the mid-infrared light emitting diode, wherein the black phosphorous layer contacts the graphene lower electrode layer and the graphene upper electrode layer, and the graphene lower electrode layer and the graphene upper electrode layer are respectively electrically connected to the plurality of electrodes.

6. The silicon photonic circuit according to claim 5, wherein the substrate comprises a silicon layer, a silicon dioxide layer, or a combination thereof.

7. The silicon photonic circuit according to claim 5, wherein the mid-infrared light emitting diode further comprises:
    a hexagonal boron nitride covering layer, arranged on the graphene upper electrode layer.

8. A manufacturing method of a silicon photonic circuit, comprising:
    forming a silicon waveguide and a plurality of electrodes on a substrate, so as to form a silicon waveguide device, wherein the plurality of electrodes separated from the silicon waveguide;
    forming a graphene lower electrode layer, a black phosphorous layer, and a graphene upper electrode layer by mechanical exfoliation;
    vertically stacking the graphene lower electrode layer, the black phosphorous layer, and the graphene upper electrode layer in sequence by dry transfer, so as to form a mid-infrared light emitting diode, wherein the graphene lower electrode layer, the black phosphorous layer, and the graphene upper electrode layer sequentially arranged along a thickness direction of the mid-infrared light emitting diode, wherein the black phosphorous layer contacts the graphene lower electrode layer and the graphene upper electrode layer; and
    forming the mid-infrared light emitting diode on the silicon waveguide device by dry transfer, wherein the graphene lower electrode layer and the graphene upper electrode layer are respectively electrically connected to the plurality of electrodes.

9. The manufacturing method of a silicon photonic circuit according to claim 8, wherein the substrate comprises a silicon-on-insulator substrate.

10. The manufacturing method of a silicon photonic circuit according to claim 8, wherein the mid-infrared light emitting diode further comprises a hexagonal boron nitride covering layer, and the manufacturing method of a silicon photonic circuit further comprises:
    forming the hexagonal boron nitride covering layer by mechanical exfoliation; and
    arranging the hexagonal boron nitride covering layer on the graphene upper electrode layer by dry transfer.

* * * * *